(12) United States Patent
Nikitin

(10) Patent No.: US 6,978,215 B2
(45) Date of Patent: Dec. 20, 2005

(54) METHOD OF DETERMINING OF TRUE NONLINEARITY OF SCAN ALONG A SELECTED DIRECTION X OR Y IN SCAN MICROSCOPE

(75) Inventor: Arkady Nikitin, Ardsley, NY (US)

(73) Assignee: General Phosphorix LLC, Ardsley, NY (US)

( * ) Notice: Subject to any disclaimer, the term of this patent is extended or adjusted under 35 U.S.C. 154(b) by 103 days.

(21) Appl. No.: 09/945,527

(22) Filed: Sep. 4, 2001

(65) Prior Publication Data

US 2003/0055588 A1 Mar. 20, 2003

(51) Int. Cl.$^7$ .............................................. G01D 18/00
(52) U.S. Cl. ........................ 702/95; 250/307; 250/311; 702/85
(58) Field of Search .............................. 702/85, 94, 95, 702/150; 73/105; 250/234, 306, 307, 561, 310, 311; 310/316, 317, 328; 359/202

(56) References Cited

U.S. PATENT DOCUMENTS 5,825,670 A * 10/1998 Chernoff et al. .............. 702/85

* cited by examiner

Primary Examiner—John Barlow
Assistant Examiner—John Le
(74) Attorney, Agent, or Firm—I. Zborovsky

(57) ABSTRACT

This invention allows the scan nonlinearity of different type of scanning microscopes to be measured, including: optical, confocal, scanning electron and scanning probe microscopes. The scan nonlinearity of the scanning type measuring microscopes can be considerable source of errors in precise measurements of the Critical Dimension—CDs. The invention allows scanning measuring microscopes to be certified for scan nonlinearity; this invention can be used for the monitoring, adjustment and/or alignment of these type instruments. The high reliability of scan nonlinearity determination is achieved with the use of a pair of offset images of a calibration structure and consequent computer analysis of the signal differences. In addition to scan nonlinearity of a scanning measuring microscope being determined this proposed invention allows determination of heterogeneity of the pitch values intrinsic to any test-objects with periodic structure used as calibration references.

11 Claims, 13 Drawing Sheets

Transformation of the two-dimensional individual pitch values array (a) into one-dimensional mean pitch values profile (b).

3. are the individual pitch values;
4. is the mean pitch values profile obtained by averaging of individual pitch values along Y-direction.

Periodic test-object orientation on the microscope stage.

1. is the microscope frame(field of view);
2. are the diffraction grating strip images.

The arrow at the top of the frame indicates the line scan direction.

Two-dimensional array of signal values.
1. is the microscope field of view;
2. are the individual signal values at places with coordinates X and Y.

The procedure of arrays averaging.

a) is the set of initial two-dimensional signal arrays;
b) is the averaged two-dimensional signal array;
1. is the microscope field of view; 2. are the signal values in the initial two-dimensional arrays; 3. is the signal values in the averaged two-dimensional array.

Shift of the diffraction grating image in the microscope field of view
according to Claim 1.e.
Row a) is the initial grating image; row b) is the image of shifted grating.
The arrow at bottom right indicates the shift direction.

Transformation of two-dimensional individual signal values array (a) into two-dimensional individual pitch values array (b).
1. is the microscope field of view;
2. are the individual signal values; 3. are the individual pitch values.

Transformation of the two-dimensional individual pitch values array (a) into one-dimensional mean pitch values profile (b).

3. are the individual pitch values;
4. is the mean pitch values profile obtained by averaging of individual pitch values along Y-direction.

Signal cutting off by threshold (Th).
The solid curve represents the dependence of video-signal S(x) plotted against coordinate X along line scan.
The sign + indicates the position of the Centres of mass of signal "islands".

Shift of the strip pair across microscope field of view according to Claim 7.

The arrow at the top of frame indicates the shift direction; the arrow at the frame middle indicates the shift magnitude δX.

1 is the microscope frame(field of view);
2 are the test-object strips images.

Transformation of the one-dimensional individual pitch values array (a) into mean pitch value (b) according to Claims 5d and 5h.

3. are the individual pitch values versus coordinate Y; 4. is the mean pitch value obtained by averaging of individual pitch values along Y-direction.

Test-object geometry according Claim 7 and its orientation on the microscope stage.

1 is the microscope frame (field of view);
2 are the test-object strips images.
The arrow at top of the frame indicates the line scan direction.

Geometry of the test-object according Claim 10.

P is the distance between features 1 and 2 i.e. pitch value.

Geometry of the test-object according Claim 11.
$P_X$ is the distance between features 1 and 2 i.e. the pitch value along X-axis;
$P_Y$ is the distance between features 1 and 3 i.e. the pitch value along Y-axis.

The comparison of apparent (1) and true (2) scan non-linearity of the attested SEM.
The tar δ (percents) plotted along Y is showing how mach real local magnification differs from average one.

The Sample non-uniformity

METHOD OF DETERMINING OF TRUE NONLINEARITY OF SCAN ALONG A SELECTED DIRECTION X OR Y IN SCAN MICROSCOPE

BACKGROUND OF THE INVENTION

The present invention relates to dimensional metrology and can be used for certification of scanning measuring devices used for measurement of sizes in micron, submicron and nanometer scales.

Scanning measuring devices, such as optical scanning microscopes which include confocal microscope, scanning optical microscope of a near field, scanning electron microscopes, as well as scanning tunneling and atomic-force microscopes which are generally designated as scanning probe microscopes are used in growing numbers of small and super small sizes in a modern industry, in particular in micro electronics as described for example in "The International Technology Road Map for semiconductors SIA Sematech, 1999". Potentially high accuracy of measurements achievable with the use of the above listed devices is limited. The reason is in particular the presence of uncontrollable, but significant errors in their scanning systems, or in other words non-linearity of moving of a mechanical, optical or electronic probe on a surface of an object. In U.S. Pat. No. 5,825,670 it is stated that the nonlinearity of development measuring tools on a basis of scanning probe microscopes reaches several percentage points and various ways of indemnification of these errors caused by nonlinearity of scanning are considered. In "Magnification calibration of CD/SEM s for sub-100 nm metrology" by A. Sicignano, et al, presented at SPIE's 45th Annular Meeting, International Symposium on Optical Science and Technology, San Diego, Calif., August 2000, detection of significant non linear distortions with fixing of the images of micro objects, whose sizes are measured in a Scanning Electronic Microscope was reported. The methods of detection and compensation of non linear distortions disclosed in the last two references provide the use of special test-objects with a periodic structure, i.e. one-dimensional or two dimensional diffraction gratings. It is assumed that the above mentioned test objects represent the sets of quite identical elements (features): one-dimensional strips or two-dimensional figures located at strictly identical distances from each other. This idealized representation is inadequate to the reality. Even more perfect diffraction gratings created by nature itself, in particular the patterns from atoms on the surface of single mono crystals do not completely respond to such idealization for many reasons: because of mosaic character of the surface of real crystals, influence of point defects of structure-foreign atoms, vacancies, dislocations, stacking folds and other deviations from strict periodicity. In addition, the interatomic distances in crystals are too small to be used as a scale for measuring tools on the basis of the above mentioned microscopes: in the microscope of the above mentioned types the architecture of atomic pattern is simply indiscernible. This realization corresponds even less to hand made test objects because of the "technological noises" which accompany any process of manufacture of any periodic structure.

It is best to be admitted to the imperiodic test object to a certain degree is imperfect: the elements of diffraction gratings are not identical and they are not located at equal distances, which causes a non uniformity of pitch of the diffraction gratings in different places.

It is therefore possible to conclude the nonlinearity of the image in scanning system which is determined in experiments with diffraction gratings is actually an imaginary value. It is obvious that the imaginary nonlinearity of the image as a result of interaction of two different components: A—actual nonlinearity of scanning devices; and B—non uniformity of a pitch of the test objects. It is desirable to eliminate or to minimize the contribution of the actual nonlinearity of the scans.

The non uniformity of the pitch of the diffraction grading is an objective and important characteristic of the test object, and its compensation has an insulated issue or within the imaginary nonlinearity of the image is unacceptable, since it represents actually a deliberate distortion of the image of a selected portion of the test object. When real, non perfect diffraction gratings are utilized, a paradoxical situation is created: The more accurate is the compensation of the imaginary nonlinearity of image, the greater is "over compensation" of the real nonlinearity of the scan. It can be seen that if the non uniformity of the test object exceeds the real nonlinearity of scan, the compensation of the imaginary nonlinearity of the image in accordance with the above mentioned U.S. patent will lead to worsening of the actual nonlinearity of the system, instead of its improvement. It is therefore important to determine the contribution of the nonlinearity of scan and non uniformity of the test object into a joint, imaginary nonlinearity of the image.

SUMMARY OF THE INVENTION

Accordingly, it is an object to provide a method of determination of a scan nonlinearity in scanning microscopes, which avoids the disadvantages of the prior art.

In keeping with these objects and with others which will become apparent hereinafter, one feature of present invention resides, briefly stated, in a method of determination of true nonlinearity of scan along a selected direction x or y in scan microscope, which includes the steps of orienting a test object on a microscope space so that a direction of strips of periodic pressure is perpendicular to a scanning line; scanning of the test object along the axis X and Y for forming a first two dimensional array of signal value; line by line measuring of pitch values between two strips of a diffraction grating and conversion of a first two dimensional array of signal values into a first two dimensional array of pitch values; averaging of the pitch values along all lines of a frame along a direction perpendicular to the scanning line and converting of the first two dimensional of array of pitch values into a first one dimensional profile of dependence of the average pitch from a coordinate along the scanning line; displacement of the test object along the scanning line by a value of one pitch along or opposite to a probe movement; another scanning of the test object along the axis X and Y for forming a second, displaced array of signal values; line by line measuring of pitch values between two neighboring strips of degrading and converting of the second two dimensional array of signal values into a second two dimensional array of pitch values; averaging of the pitch values along all lines of the frame along a direction perpendicular to the scanning line and converting the second two dimensional array of pitch values into a second one dimensional profile of dependence of the average pitch of the coordinate along the scanning line; calculating of a differential nonlinearity of scan along the selected scanning direction in accordance with the expression $$[DNL(I+1, I)=\pm\{P(I)-P(I)\}]$$

$$DNL(I)=\pm\{P'(I)-P(I)\}$$

wherein [DNL (I+1,I)] DNL (I) is a differential nonlinearity of scan on a portion of a field of view with number I+1 relative to the portion with number I; P'(I) is an average pitch with number I measured in accordance with the second, shifted one dimensional profile P(I) is an average value of the same pitch with I measured in accordance with the first, initial one dimensional profile, with selecting a plus sign if a displacement was performed along the scanning line and minus sign if the test object was displaced opposite to the movement of the probe along the scanning line, with I from 1 to N wherein N is a number of fixed pitches along the line of scanning; calculated an integrated nonlinearity along a whole field of view in accordance with the formula $$\left[ INL(I+1) = \sum_{K=1}^{I} DNU(KI) \right]$$

$$INL(I+1) = \sum_{k=1}^{I} DNU(k)$$

wherein INL(I+1) is an integral nonlinearity of scan on the portion of the field of view with number I+1; DNL(k) is a differential nonlinearity on the portion of the field of view with the number k, and performing summation on all portions on the field of view preceding the portion with number I+1; calculating a differential non uniformity of the test object in accordance with the expressions DNU(I,J)=±{P(I)–P'(J)} and [I=J±,] I=J±1 wherein DNU(I,J) is a differential non uniformity of the pitch of test object on the portion between the pitch with a number I and the pitch with the number J; P(I) is an average pitch with the number I in the first, initial one dimensional profile; P'(J) is an average pitch with the number J on the second, shifted one dimensional profile, with selection of a plus sign when the displacement was performed along the displacement of the probe and the minus sign where the displacement was performed in an opposite direction; and calculation of an integrated non uniformity of the test object in accordance with the formula $$\left[ P(I+1) - P(1) + \sum_{k=1}^{I} DNU(k) \right],$$

$$P(I+1) = P(1) + \sum_{k=1}^{I} DNU(k)$$

where P(I+1) is a corrected, true value of the pitch with number [I=1] I+1; P(1)– is a base value of the pitch with number 1; and performing [assumation] summation on all pitches preceding the pitch with the number I+1.

When the method is performed in accordance with the present invention, it eliminates the disadvantages of the prior art.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED
EMBODIMENTS

Figure 1:
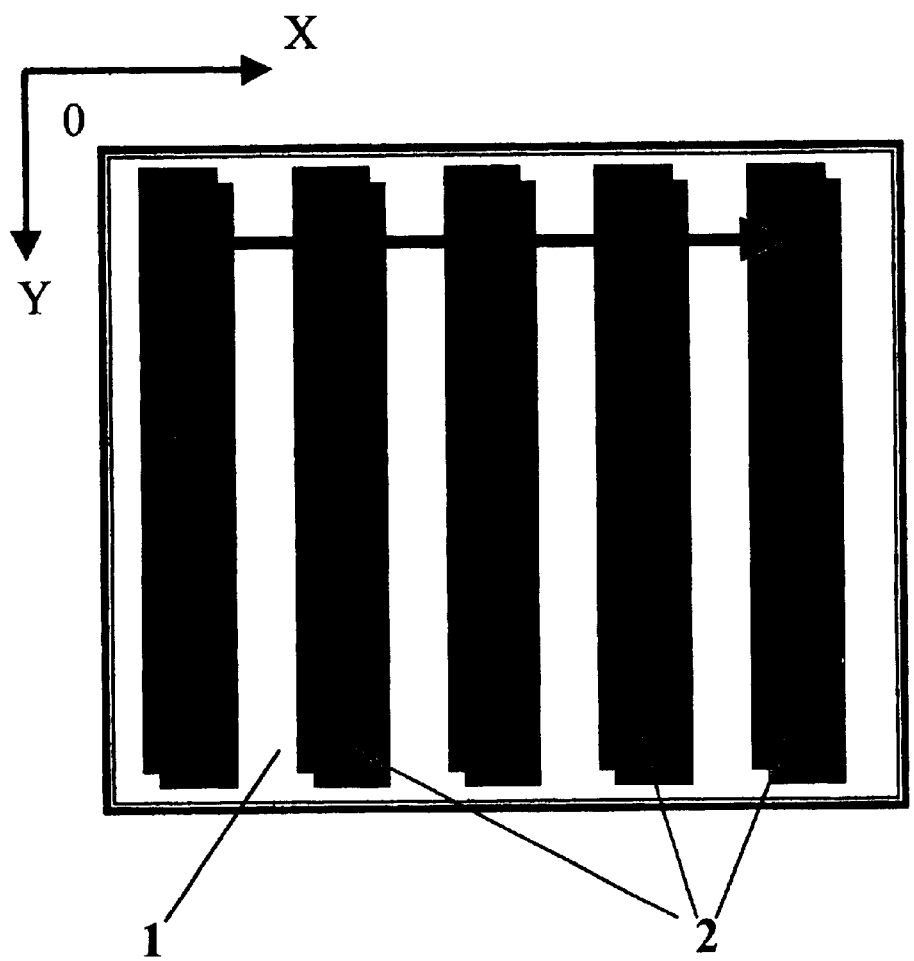
FIG. 1 is a view showing a correct orientation of a test object on a microscope stage, with a selected scanning direction, which is horizontal on the drawing along the axis X, is perpendicular to the orientation of strips of the diffraction grading.
Figure 2:
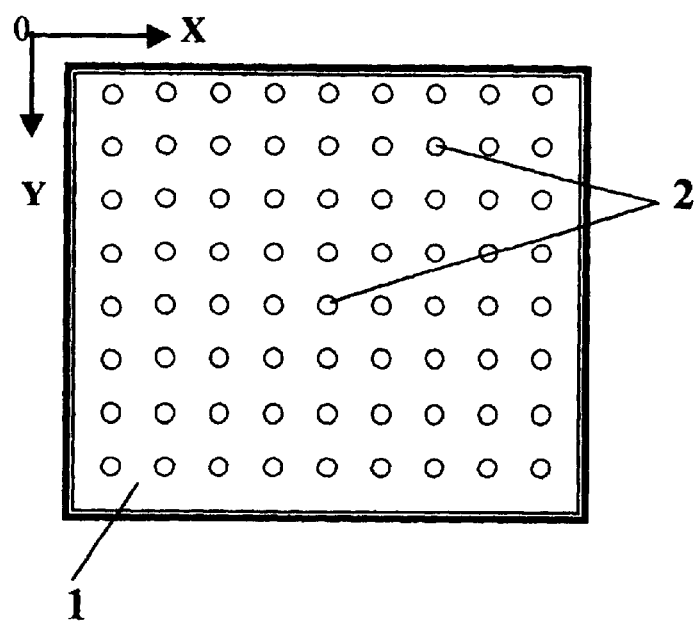
FIG. 2 is a view illustrating a structure of a two-dimensional array of signal values, which is obtained as a result of scanning of test-object in accordance with two directions.
Figure 4:
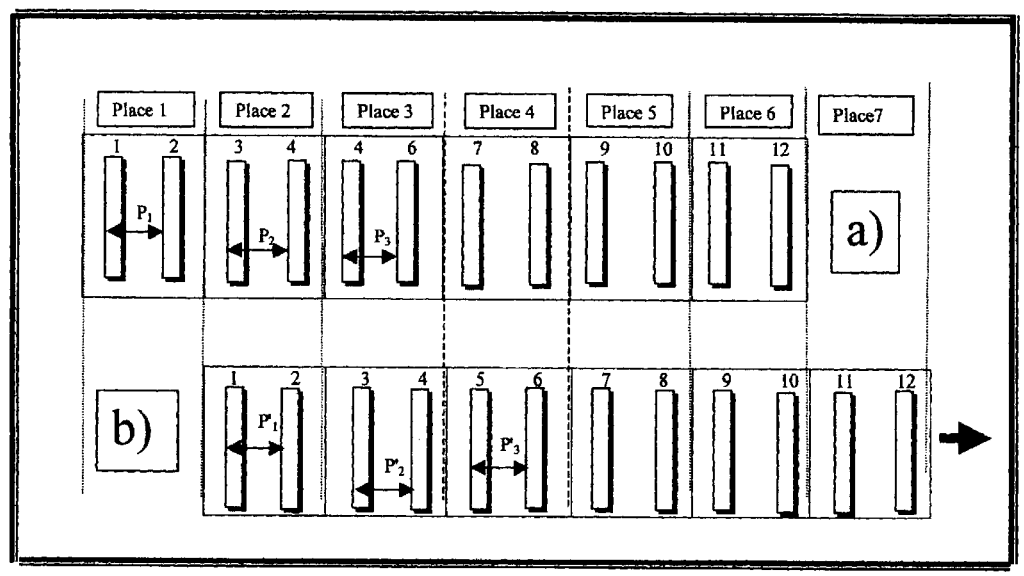
FIG. 4 is a view schematically illustrating the procedure of shifting of the test object, with an upper row illustrating the test object in an initial position and the lower row illustrating the test object after the shift with the shift direction indicated with an arrow in the right lower area.

In accordance with the present invention first of actions are performed directly in the scanning microscope. The test object is oriented on the microscope stage so that the direction of strips of the periodic structure is perpendicular to the line of scanning in accordance with a selected direction as shown in FIG. 1. The test object is scanned along the axis X and Y so that a first two dimensional array of signal values shown in FIG. 2 is obtained. The test object is then displaced along the direction of scanning by the value of one pitch in the direction of scanning, as indicated by the arrow in FIG. 4, or in an opposite direction. The test object is again scanned along the axis X and Y, and as a result a second, shifted array of signal values which is analogous to the one shown in FIG. 2 in accordance with the structure, is determined. The first and second arrays are transported in the computer memory along the connection lines or by means of a temporary information storage on hard or flexible disks, diskettes.

Figure 5:
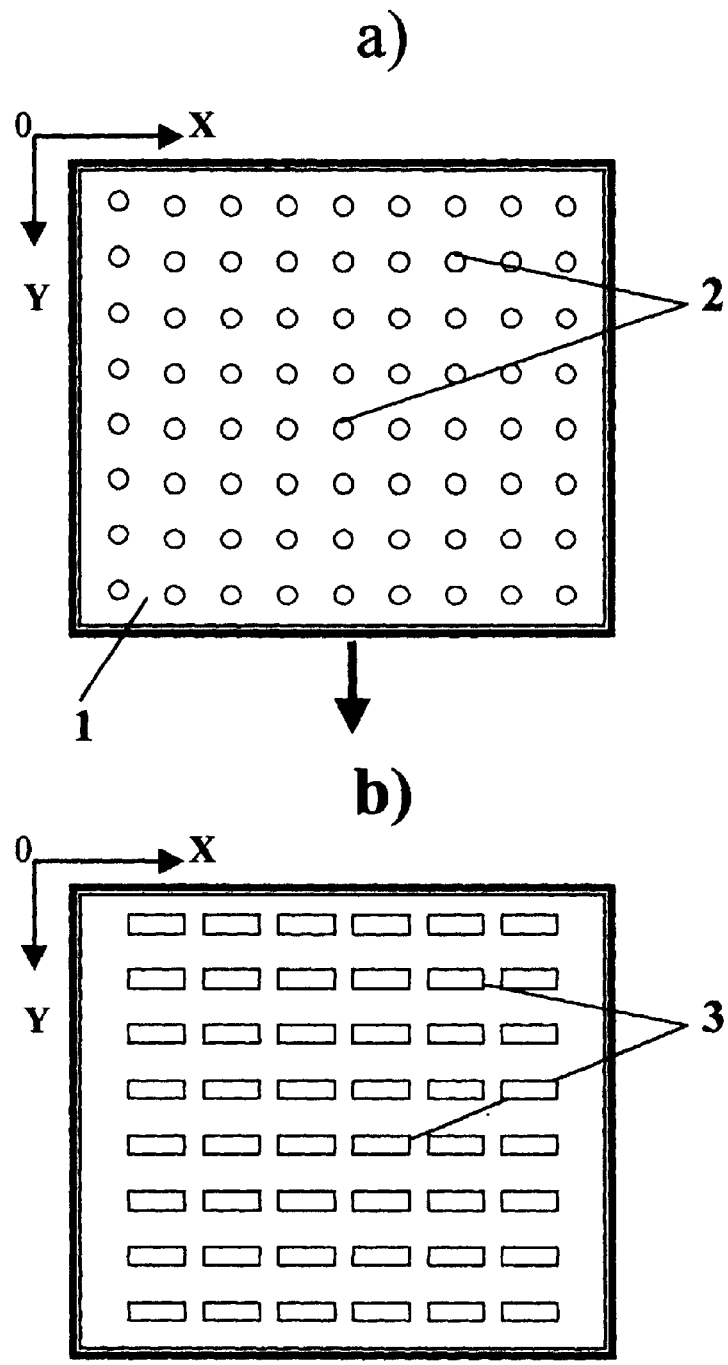
FIG. 5 is a view illustrating a procedure of a conversion of the two-dimensional signal array into two-dimensional pitch value array.
Figure 6:
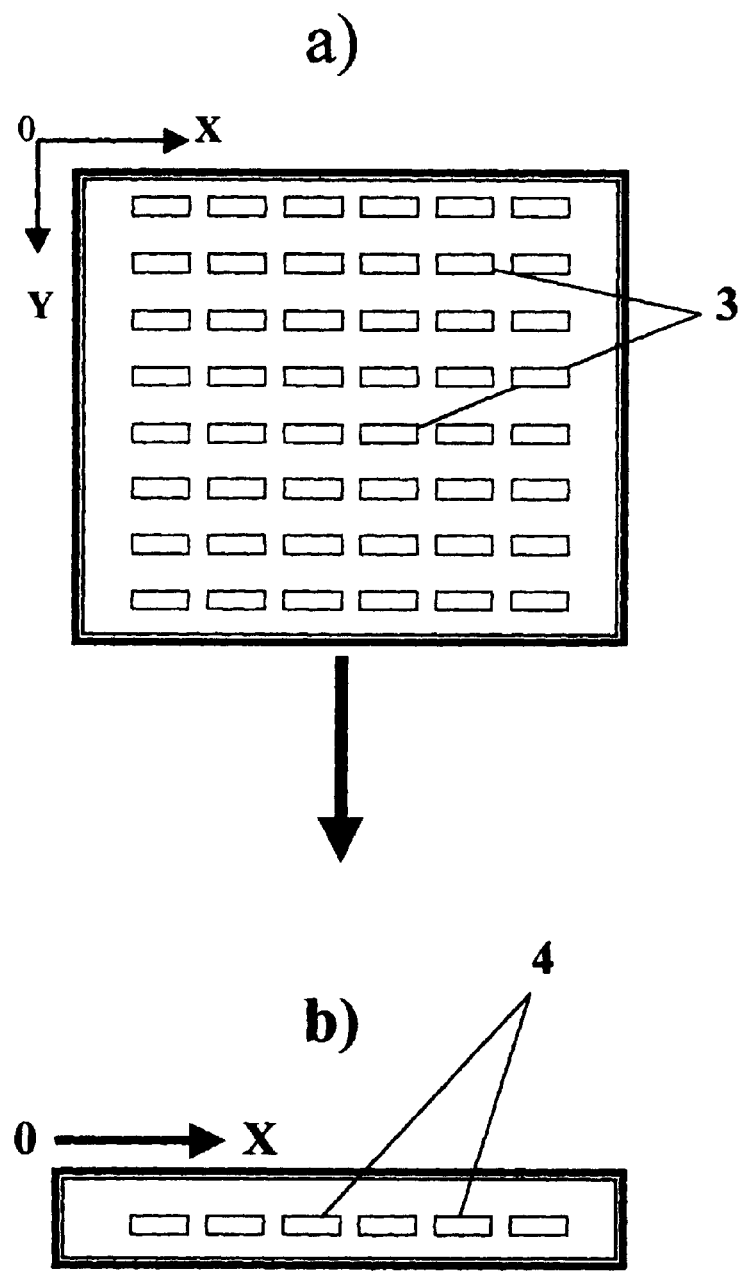
FIG. 6 is a view illustrating a procedure of conversion of the two-dimension array of pitch values into one-dimensional profile of dependency of the average pitch from the coordinate along the scanning line.

Then the next actions are performed outside of the microscope, by a computer in accordance with a computer program. The microscope can be switched off after the above mentioned operations. Values of pitch (distances between neighboring strips of the grating) are measured line-by-line in the first two dimensional signal array, and based on it a first two-dimensional array of pitch values is formed as shown in FIG. 5. Then values of pitch (distances between neighboring strips of the grating) in the second two dimensional signal array are measured line-by-line, and based on this a second two dimensional array of pitch values is formed as shown in FIG. 5 as well. The pitch values along the direction which is perpendicular to the selected scanning direction are average, in order to convert the first two dimensional array of pitch values and to a first one dimensional profile of dependents of the average pitch from the coordinate along the selected scanning direction as shown in FIG. 6. When the pitch values along the direction which is perpendicular to the selected scanning direction are average to convert the second two dimensional array of pitch values into a second one-dimensional profile of dependents of the average pitch from the coordinate along the selected scanning direction as also shown in FIG. 6. A differential scan nonlinearity along the selected scanning direction is calculated in accordance with the following expression:

$$[DNL(I+1,I)=\{P'(I)-P(I)\},]$$

$$DNL(I)=\{P'(I)-P(I)\},$$

wherein [DNL (I+1,I)] DNL (I) is a differential scan nonlinearity on a portion of field of view with the number I+1 in relation to the portion with number I; P'(I) is an average pitch with the number I measured in accordance with the second, shifted one dimensional profile P(I) is an average value of the same pitch with the number I measured in accordance with the first (initial) one dimensional profile. The plus sign is selected if the shift was performed in direction of the movement of the probe, and the minus sign is selected if the plus object was displaced in an opposite direction.

Then the integrated nonlinearity is calculated along the whole field of view in accordance with the formula:

$$\left[INL(I+1)=\sum_{K=1}^{I}DNU(K)\right]$$

$$INL(I+1)=\sum_{k=1}^{I}DNL(k)$$

wherein INL(I+1) is an integral scan nonlinearity in the portion of the field of view with the number I+1; DNL(k) is a differential nonlinearity on the portion of field of view with number k, and the summation is performed on all portions of the field of view preceding to the portion with the number I+1.

The differential non uniformity of the test object is calculated in accordance with the expressions:

$$[DNU(I,J)=\pm\{P(I)-P'(J)\}]DNU(I)=\pm\{P(I)-P'(J)\} \text{ and } I=J\pm1,$$

when [DNU(I,J)] DNU(I) is a differential pitch non uniformity of the test objects on the portions between the pitch with the number I and the pitch with the number J; P(I) is an average pitch with the number I in the first (initial) one dimensional profile; P'(J) is an average pitch with the number J in a second (shifted) one dimensional profile. In the presented expressions the plus sign is selected when the shift was performed in direction of displacement of the probe, and the minus sign is selected when the shift was performed in the opposite direction.

Then the integrated non uniformity of the test object is calculated in accordance with the formula:

$$\left[P(I=1)-P(I)+\sum_{k=1}^{I}DNU(k)\right]$$

$$P(I+1)=P(1)+\sum_{k=1}^{I}DNU(k)$$

wherein P(I+1) is a corrected (true) value of the pitch with number [I=1] I+1; P(1) is a base value of the pitch with number 1; and the summation was performed over all pitch preceding the pitch with number I+1.

Figure 3:
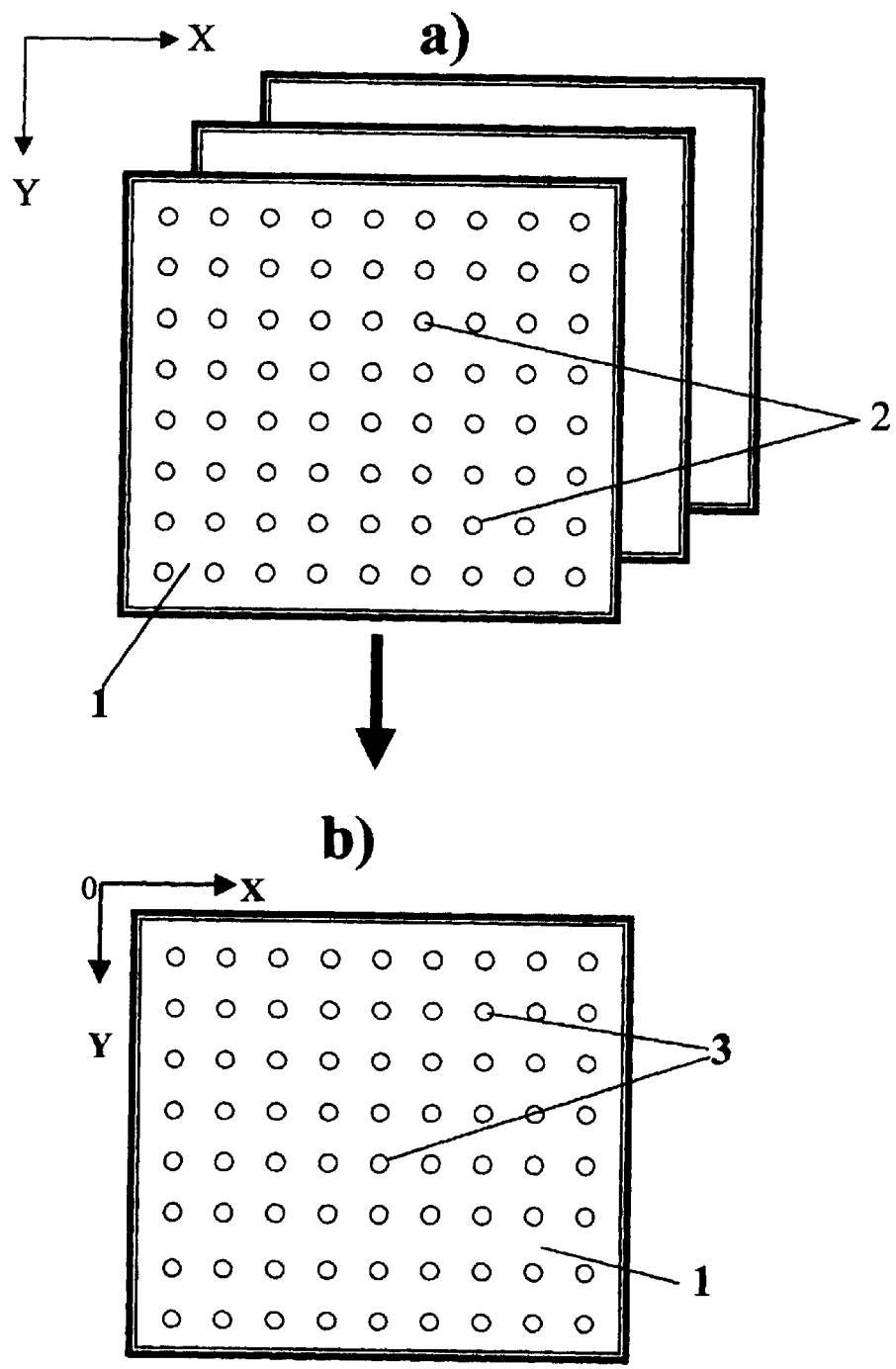
FIG. 3 is a view illustrating a procedure of averaging of signal arrays obtained during repeated scanning.

It should be mentioned that the orientation of the test object on the stage of the microscope is performed as explained herein above and illustrated in FIG. 1. The steps of scanning of the test object are performed many times, and the results of the repeated scanning, or in other words the sets of the two dimensional arrays are average with the formation of the first and second two dimensional arrays of average signals, which then are utilized as the initial two dimensional arrays for performing the corresponding steps, as shown in FIG. 3.

Figure 7:
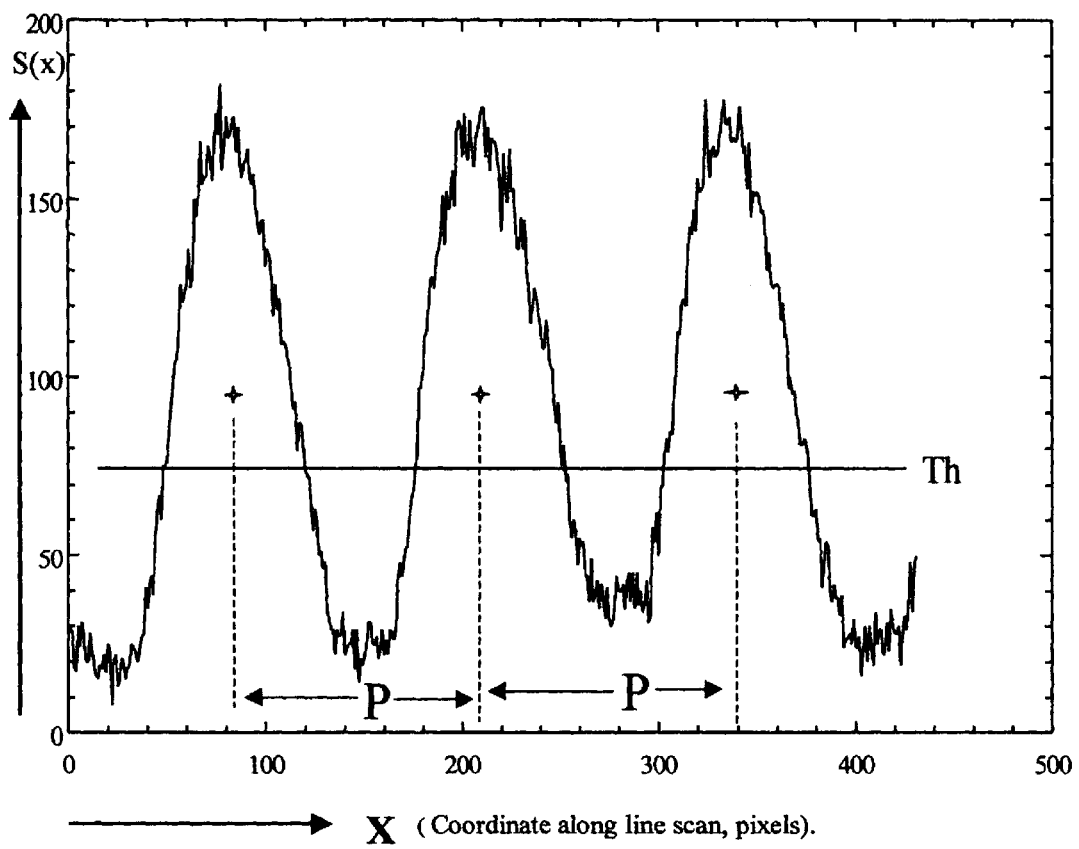
FIG. 7 is a view illustrating a cut-off of the signal in accordance with a preliminarily determined level, formation of an island signal structure, and principles of pitch measurements as a distance between islands centers of mass.

In these steps it is necessary to introduce the following changes: The signal must discriminated (cut off) in accordance with a preliminarily established cut off threshold, and the signal islands are formed as shown in FIG. 7. The determination of the position of each island as an X coordinate of the mass center of each island must be performed. The pitch must be calculated at a distance between the mass centers of the neighboring islands.

These steps must be complimented by the selection of the threshold level of signal within a range of 0.3–0.6 signal amplitude.

Figure 8:
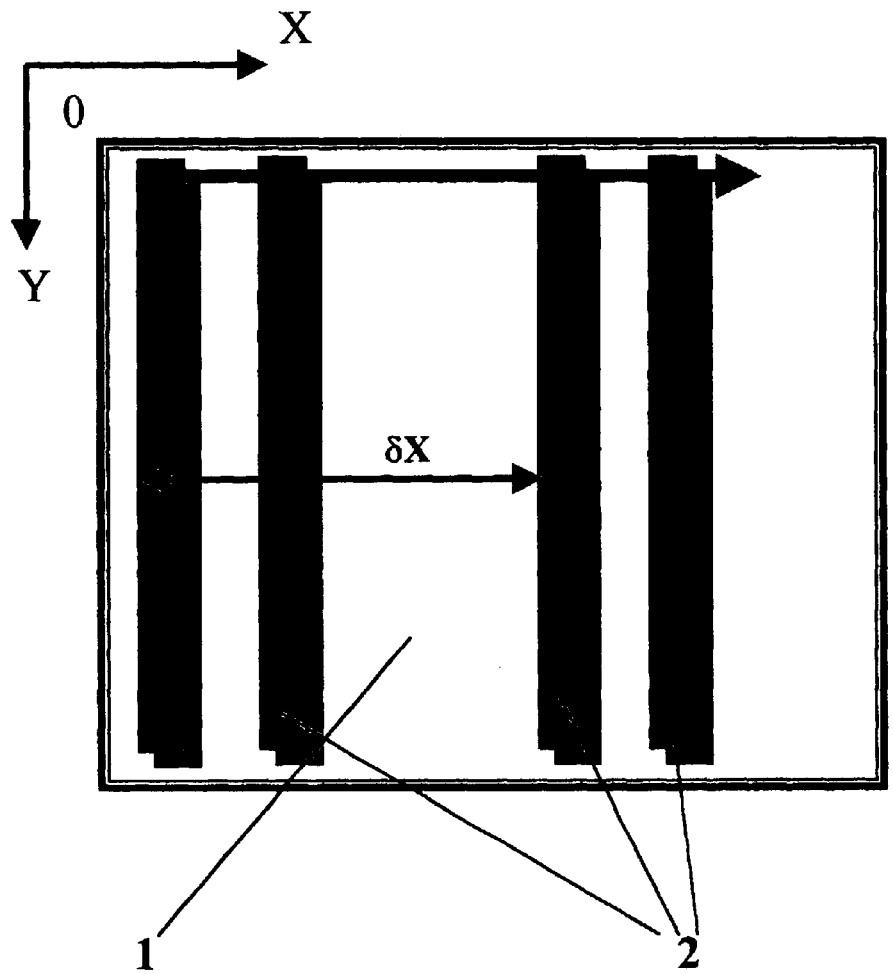
FIG. 8 is a view illustrating a procedure of shifting of the test object, when the test object is a sample containing no more than two strips.
Figure 9:
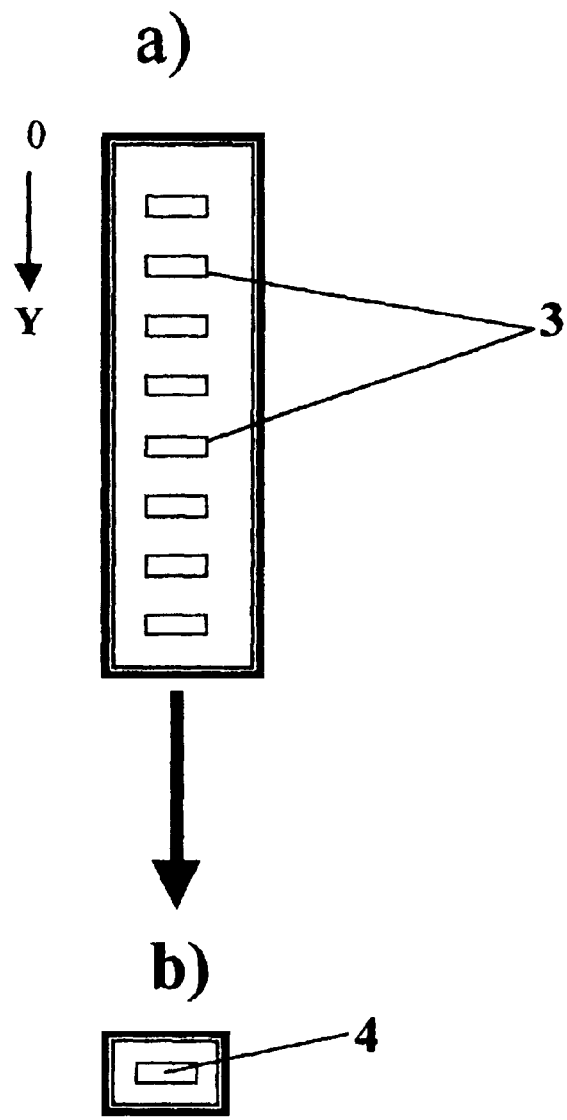
FIG. 9 is a view illustrating the procedure of averaging of individual pitch values with calculation of its average value.

In accordance with another embodiment of the present invention, after orientation of the test object on the microscope stage and its scanning by a probe along the directions X and Y, the following actions can be performed. The pitch values between two selected neighboring strips of the grating is performed line by line, and the first two dimensional array of signal values is converted into a first one dimensional array of line values of pitch between the selected strips as shown in FIG. 6. The pitch values are average along all lines, and a calculation of the first average value of the pitch P of the selected pair of strips is performed as shown in FIG. 9. The test object is displaced on the microscope stage to the right and to the left by a fixed distance δX along the scanning direction as shown in FIG. 8. Another scanning of the test object along the axis X and Y is performed for forming the second two dimensional array of signal values analogous to that shown in FIG. 2. The pitch values between the same two selected neighboring strips of the grating are measured line by line, and the second two dimensional array of signal values is converted into the second one dimensional arrays of the line pitch values between selected strips as shown in FIG. 6. The pitch values along all lines are average, and the calculation of the second average value of the pitch P' between the selected pair of strips is performed as shown in FIG. 9. The differential scan nonlinearity is calculated along the dimension of displacement on the portion of the field of view between two positions of the selected pair of strips according to the equation:

$$DNL(X+\delta X, X) = P' - P$$

wherein DNL(X+δX, X) is a differential line scan nonlinearity on the portion of a field of view between positions X+δX and X Then again the steps starting from the displacement of the test object to the last step are repeated, with displacement of the image of the selected pair of lines along the whole field of view of the microscope. The integrated scan nonlinearity is calculated in accordance with the formula $$INL(X = \Sigma \delta X) = \sum_{k=1}^{l} DNL(k)$$

wherein [INL(X-Σ δX)] INL(X=Σ δX) is an integral line scan nonlinearity on the portion with a coordinate which is equal to a sum of all displacements X=ΣδX, and the summation is performed in accordance with the number of displacements of the test object of the field of view of the microscopes.

The steps of line by line measurements of pitch values between neighboring strips of the grating, and another scanning of the test object can be repeated many times and the results of additional measurements are averaged before averaging of the pitch values along the lines and before averaging of the pitch values along the lines.

Figure 10:
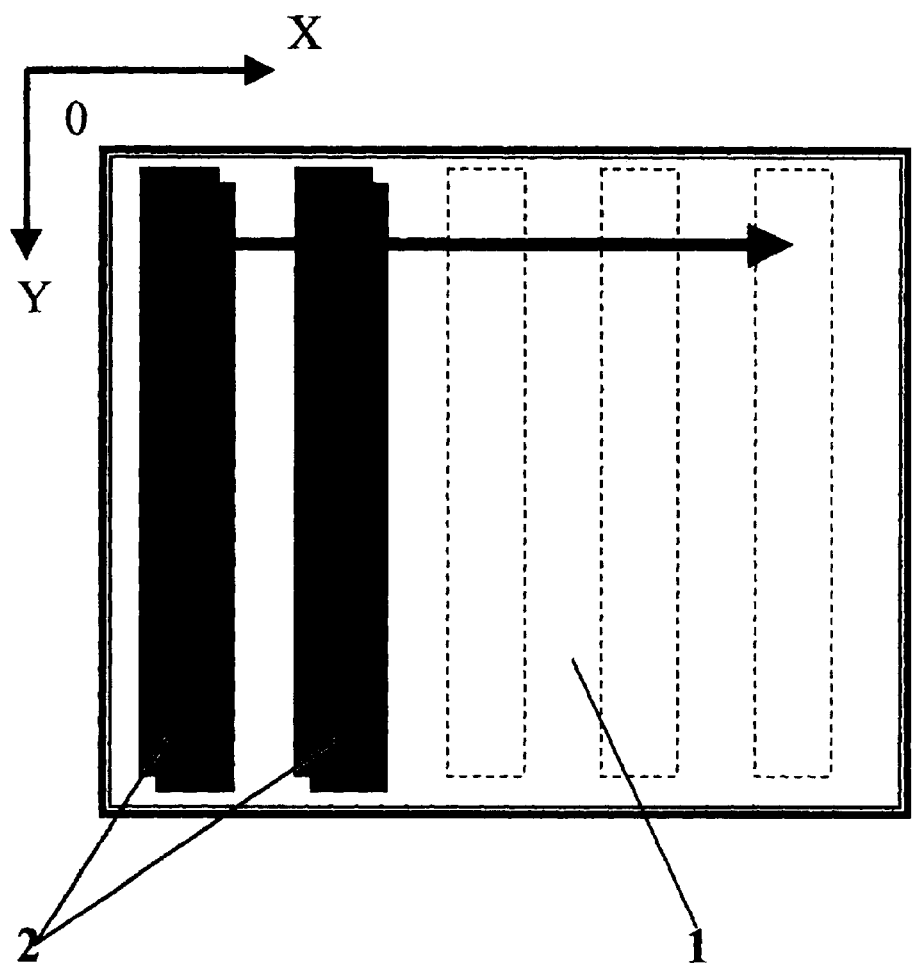
FIG. 10 is a view illustrating a geometry of the test object in accordance with one embodiment of the present invention.

In accordance with the present invention the test objects can be made in any acceptable way, but it contains the image of at least two strips as shown in FIG. 10.

Figure 11:
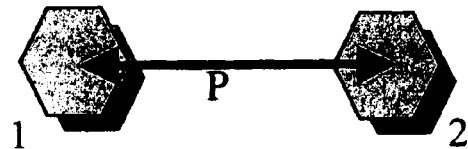
FIG. 11 is a view showing the geometry of the test object in accordance with another embodiment of the present invention.

The discrimination (cut off) of signal in accordance with the preliminarily predetermined threshold and formation of the signal islands can be performed as shown in FIG. 11. Also, the determination of the position of each island as an X coordinate of the center of mass of each island can be also performed as shown in FIG. 1. Finally, the calculation of the pitch as a distance between the centers of mass of neighboring islands can be performed as shown in FIG. 11 as well. Here the selection of the threshold of signal can be performed within the range of 0.3–0.6 of signal amplitude.

Figure 12:
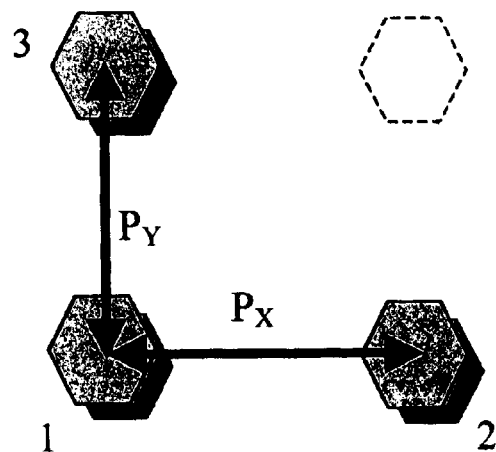
FIG. 12 is a view showing the geometry of the test object in accordance with a further embodiment of the present invention.
Figure 13:
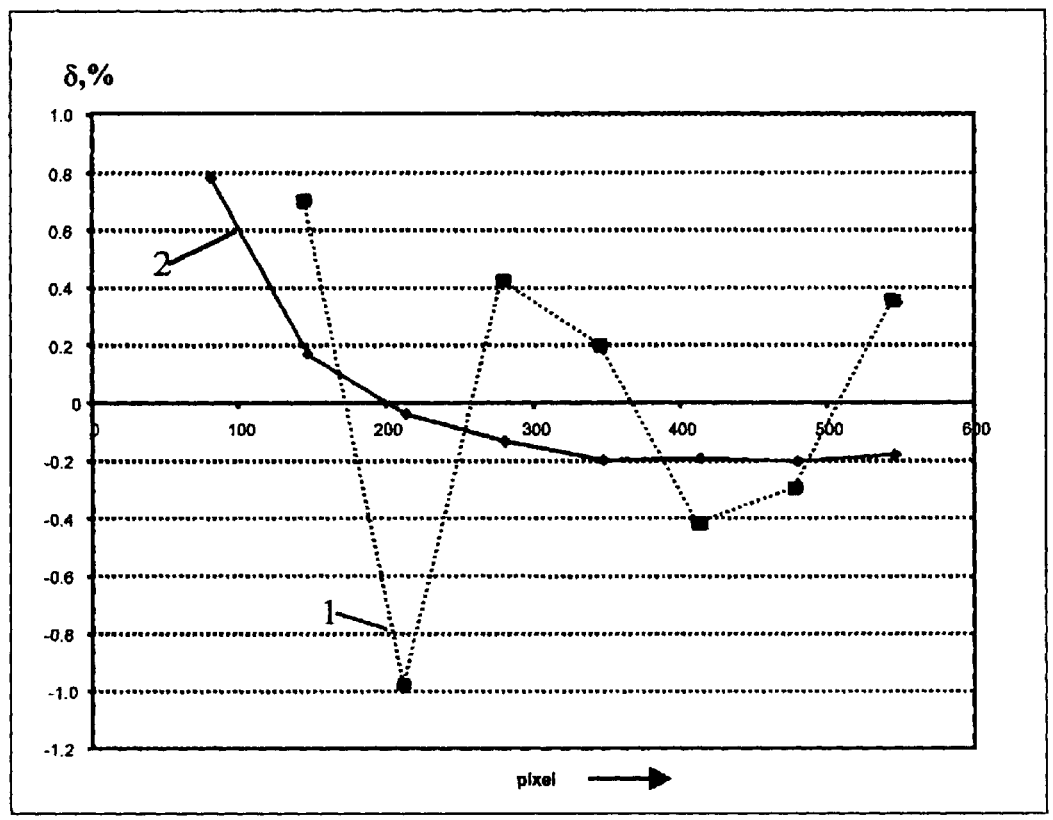
FIG. 13 is a view showing a comparison of the image complex nonlinearity and true nonlinearity of the scan system, with coordinates in the field of view of the microscope plotted along the axis X in pixels, and values of imaginary nonlinearity of image illustrated in a broken line 1 plotted along the axis Y, or true nonlinearity of line scan shown in broken line 2, so that a comparison of the lines shows a contribution of the nonlinearity of the test objects into the total imaginary nonlinearity of image.

As a test object, also a figure can be used, which is made in any possible way and at the same time contains the image of not less than two-dimensional objects. The orientation of such a test object on the microscope stage is selected so that the line connecting the centers of mass of the neighboring islands is parallel to the direction X or Y, depending on whether nonlinearity of scan is attested in accordance with the axis X or Y, as shown in FIG. 12. Also as a test object, a figure can be used which contains the image of not less than two pairs of two dimensional objects. The lines which connect the centers of mass of neighboring islands can form a straight angle, and orientation of such a test object on the microscope stage is selected so that one of the connecting lines is parallel to the direction of scan along the axis X and the second one is parallel to the direction of scan along the axis Y as shown in FIG. 13.

The method in accordance with the present invention has been tested in experiments. The checking was performed on Electronic Scan Microscope XL-40(Philips). The test object was a fragment of the diffraction grating with an average pitch T=(449.2±0.4) nm. The operational mode of the Electron Microscope was as follows: Accelerating voltage 10 kV current of a beam of primary electrons 120 pA, a nominal magnification 50,000, a detector of secondary electrons of Everhart-Tornley with a positive displacement of a collector grid, decomposition of the frame of the image in 484 lines with 712 pixels per line. The time of recording of each frame was 50 seconds. Ratio signal/noise about 30.

Figure 14:
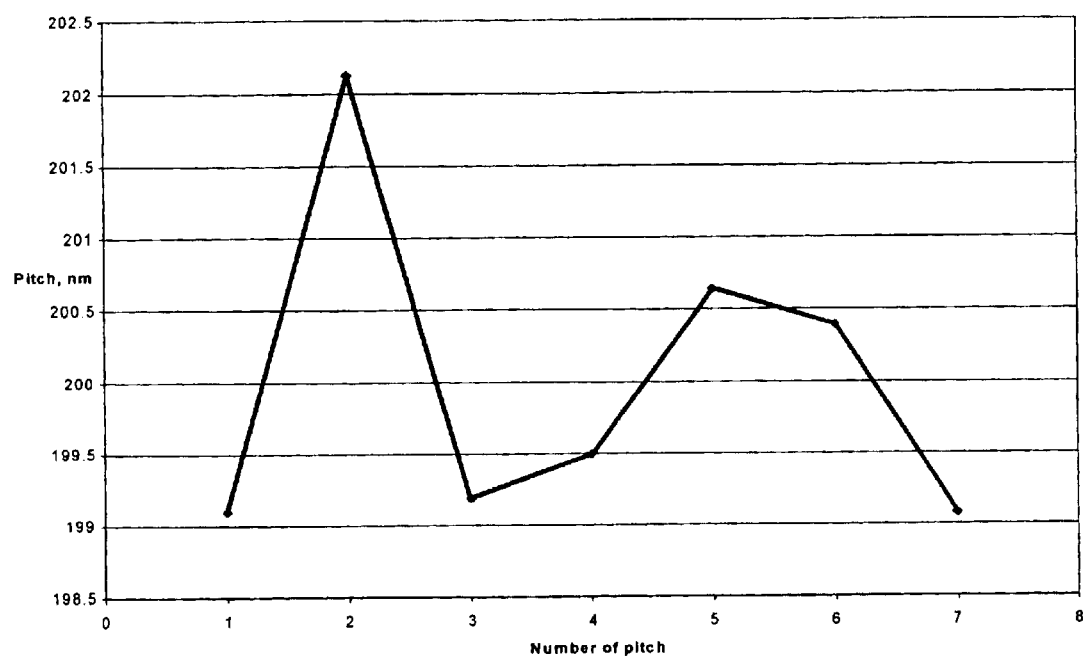
FIG. 14 is a view showing a calculated non uniformity of the grating used in the experiment, in the field of view of the microscope, with coordinates in the field of view plotted along the axis X and successive of individual pitch periods in nanometers plotted along the axis Y.

The sample of the diffraction grating was oriented so that the direction of line scan was perpendicular to the direction of strips (line scan was test). Two sets of images (files) were obtained from the selected portion; one of the sets contained the images of the initial images of diffraction grating, the other set contained displaced diffraction gratings by one pitch to the right. There were three independent frames of the image of each set, which were fixed successively and without changes in recording condition. Each of the six obtained files was subjected to a computerized processing, which included line by line calculation of the pitches, so that six two dimensional arrays were obtained containing pitch values of diffraction gratings. The results of pitch measurements were average for three independent frames in each set. Each of the two average two dimensional arrays was converted into one dimensional profile (dependence on the average pitch from coordinate X) in the field of view of the microscope. This conversion was performed by averaging of two dimensional arrays in accordance with columns (in direction Y). Subsequently the thusly obtained two one dimensional profiles were used for calculation of differential and integrated nonlinearity of line scanning, differential and integrated non uniformity of the pitch of diffraction grating on the analyzed portion. Processing time for calculation and preparation of diagrams was about 1.15 minutes (PC AMD K6 500MHz). The results of calculations are presented on FIGS. 13 and 14. It can be seen on these figures that the imaginary image nonlinearity (curve 1 in FIG. 13) and true nonlinearity of the line scan of the used electron microscope (curve 2 in the same figure) are very different. This difference, as explained above, is determined by the contribution of the non uniformity of the pitch of diffraction grating, which is illustrated in FIG. 14.

It will be understood that each of the elements described above, or two or more together, may also find a useful application in other types of methods and constructions differing from the types described above.

While the invention has been illustrated and described as embodied in a method of determination of true nonlinearity of scan along a selected direction x or y in scan microscope, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims.

What is claimed is:

1. A method of determination of true nonlinearity of scan along a selected direction X or Y in scan microscope, comprising the steps of orienting a test object on a microscope space so that a direction of strips of periodic pressure is perpendicular to a scanning line; scanning of the test object along the axis X and Y for forming a first two dimensional array of signal value; line by line measuring of pitch values between two strips of a diffraction grating and conversion of a first two dimensional array of signal values into a first two dimensional array of pitch values; averaging of the pitch values along all lines of a frame along a direction perpendicular to the scanning line and converting of the first two dimensional of array of pitch values into a first one dimensional profile of dependence of the average pitch from a coordinate along the scanning line; displacement of the test object along the scanning line by a value of one pitch along or opposite to a probe movement; another scanning of the test object along the axis X and Y for forming a second, displaced array of signal values; line by line measuring of pitch values between two neighboring strips of the grating and converting of the second two dimensional array of signal values into a second two dimensional array of pitch values; averaging of the pitch values along all lines of the frame along a direction perpendicular to the scanning line and converting the second two dimensional array of pitch values into a second one dimensional profile of dependence of the average pitch of the coordinate along the scanning line;

calculating of a differential nonlinearity of scan along the selected scanning direction in accordance with the expression $$DNL(I)=\pm\{P'(I)-P(I)\}$$

wherein DNL (I) is a differential nonlinearity of scan on a portion of a field of view with number I+1 relative to the portion with number I; P'(I) is an average pitch with number I measured in accordance with the second, shifted one dimensional profile P(I) is an average value of the same pitch with I measured in accordance with the first, initial one dimensional profile, with selecting a plus sign if a displacement was performed along the scanning line and minus sign if the test object was displaced opposite to the movement of the probe along the scanning line, with I from 1 to N wherein N is a number of fixed pitches along the line of scanning; calculated an integrated nonlinearity along a whole field of view in accordance with the formula $$INL(I+1) = \sum_{k=1}^{I} DNL(k),$$

wherein INL(I+1) is an integral nonlinearity of scan on the portion of the field of view with number I+1; DNL(k) is a differential nonlinearity on the portion of the field of view with the number k, and performing summation on all portions on the field of view preceding the portion with number I+1; calculating a differential non uniformity of the test object in accordance with the expressions $DNU(I,J)=\pm\{P(I)-P'(J)\}$ and $I=J\pm 1$, wherein DNU(I,J) is a differential non uniformity of the pitch of test object on the portion between the pitch with a number I and the pitch with the number J; P(I) is an average pitch with the number I in the first, initial one dimensional profile; P'(J) is an average pitch with the number J on the second, shifted one dimensional profile, with selection of a plus sign when the displacement was performed along the displacement of the probe and the minus sign where the displacement was performed in an opposite direction; and calculation of an integrated non uniformity of the test object in accordance with the formula $$P(I+1) = P(1) + \sum_{k=1}^{I} DNU(k),$$

where I=J+1 is a corrected, true value of the pitch with number I+1; P(1)− is a base value of the pitch with number 1; and performing summation on all pitches preceding the pitch with the number I+1.

2. A method as defined in claim 1; and further comprising performing the steps of scanning of the test object and another scanning of the test object many times, and averaging of results of the other measurements before calculation of the differential nonlinearity of scan.

3. A method as defined in claim 1, wherein the line by line measurement of the pitch values and the conversion includes discrimination of signal in accordance with the preliminarily determined threshold and forming signal islands, determining a position of each island as an X coordinate of a center of mass of each island, and calculating a pitch at a distance between the centers of mass of neighboring islands.

4. A method as defined in claim 3; and further comprising selecting the threshold within the range of 0.3–0.6 of a signal amplitude.

5. A method of determination of true nonlinearity of scan along the selected direction X or Y in scan microscope, comprising the steps of orienting the test object on a microscope stage so that a direction of strips of pitch structure is perpendicular to a scanning line, scanning of the test object along the axis X and Y for forming a first two dimensional array of signal values; line by line measuring of pitch value between two selected neighboring strips of a grating and conversion of a first two dimensional array of signal values into a first one dimensional array of line by line pitch values between selected strips; averaging of pitch values along all lines of a one dimensional array by calculating a first average value of the pitch between the selected pair of strips; displacing of the test object on the microscope stage in direction of displacement of a probe or in an opposite direction by a fixed distance δX; another scanning of the test object along the axis X and Y for forming a second two dimensional array of signal values; line by line measuring of pitch values between same two selected neighboring strips of the grating and converting of a second two dimensional array of signal values into a second one dimensional array of line by line pitch values between the selected strips; averaging of pitch values along all lines of one dimensional array by calculating a second average value of a pitch between the selected pair of strips; calculating of differential nonlinearity of line scan on a portion of a field of view between two positions X and X+δX of the selected pair of strips according to the equation $$DNL(X+\delta X,X)=P'-P$$

wherein DNL(X+δX, X) is a differential scan nonlinearity, P' is a pitch measured on a shifted image, and P is a pitch measured on original, non-shifted image another multiple displacement of the test object and repeated scanning of the test object for forming the second two dimensional array of signal values, with displacement of image of the selected pair of lines along all field of view of the microscope; and calculating an integrated nonlinearity of the line scan in accordance with the formula $$INL(X = \Sigma \delta X) = \sum_{k=1}^{l} DNL(k),$$

wherein DNL(k) is a differential non-linearity on a portion of a field of view with number k, INL(X=Σ δX) is an integrated nonlinearity of scan on the portion with X coordinate equal to a sum of all performed displacements X=93 δX, and summing in accordance with a number of displacement of the test object in the field of view of the microscope.

6. A method as defined in claim 5; and further comprising performing the steps of scanning and another scanning many times, an averaging of the results before the averaging steps.

7. A method as defined in claim 5; and further comprising using as the test object a figure which contains an image of at least two strips.

8. A method as defined in claim 5, wherein the line by line measurements include a discrimination of the signal in accordance with a preliminarily established threshold and forming of signal islands, determining of a position of each island as an X coordinate of the center of mass of each island, and calculating a pitch as a distance between the centers of mass of neighboring islands.

9. A method as defined in claim 8, wherein a threshold of signals is in the range of 0.3–0.6 of a signal amplitude.

10. A method as defined in claim 5, wherein the test object as a figure which contains an image of not less than two dimensional object, said orienting of the test objects on the microscope stage being selected so that a line connecting centers of mass of neighboring islands is parallel to the direction X and Y, depending on whether a nonlinearity along the axis X or Y is to be determined.

11. A method as defined in claim 5, wherein the test object is figure which contains an image of at least two pairs of two dimensional objects, and a line which connects centers of mass of neighboring islands forms a straight angle, while orientation of the test object on the microscope stage is selected so that one of the connecting lines is parallel to a scan direction along the axis X and another one is parallel to a scan direction along an axis Y.

* * * * *